United States Patent
Harada

(10) Patent No.: US 7,442,563 B2
(45) Date of Patent: Oct. 28, 2008

(54) METHOD FOR MANUFACTURING AND SEMICONDUCTOR LIGHT EMITTING DEVICE

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 496 days.

(21) Appl. No.: 11/237,805

(22) Filed: Sep. 29, 2005

(65) Prior Publication Data

US 2006/0065906 A1    Mar. 30, 2006

(30) Foreign Application Priority Data

Sep. 29, 2004    (JP) ............... 2004-284416

(51) Int. Cl.
H01L 21/00    (2006.01)

(52) U.S. Cl. .......................... 438/26; 438/29
(58) Field of Classification Search .................. 438/26, 438/27, 29
See application file for complete search history.

(56) References Cited

U.S. PATENT DOCUMENTS

| | | | |
|---|---|---|---|
| 5,959,316 A * | 9/1999 | Lowery | 257/98 |
| 6,066,861 A | 5/2000 | Hohn et al. | 257/99 |
| 6,245,259 B1 | 6/2001 | Hohn et al. | 252/301.36 |
| 6,277,301 B1 | 8/2001 | Hohn et al. | 252/301.36 |
| 6,576,930 B2 | 6/2003 | Reeh et al. | 257/98 |
| 6,592,780 B2 | 7/2003 | Hohn et al. | 252/301.36 |
| 6,613,247 B1 | 9/2003 | Hohn et al. | 252/301.36 |
| 6,669,866 B1 | 12/2003 | Kummer et al. | 252/301.4 R |
| 6,774,401 B2 | 8/2004 | Nakada et al. | 257/82 |
| 6,809,342 B2 | 10/2004 | Harada | 257/79 |
| 6,812,500 B2 | 11/2004 | Reeh et al. | 257/98 |
| 7,345,317 B2 * | 3/2008 | Reeh et al. | 257/98 |

FOREIGN PATENT DOCUMENTS

| | | |
|---|---|---|
| JP | 10-190065 | 7/1998 |
| JP | 2001-127346 | 5/2001 |
| JP | 2001-196639 | 7/2001 |
| JP | 2001-210872 | 8/2001 |
| JP | 2001-345483 | 12/2001 |
| JP | 2004-056075 | 2/2004 |
| JP | 2004-119838 | 4/2004 |

* cited by examiner

*Primary Examiner*—Jack Chen
(74) *Attorney, Agent, or Firm*—Cermak Kenealy & Vaidya LLP

(57) ABSTRACT

A method for manufacturing a semiconductor light emitting device can include providing a housing having a cavity and a power feed line, a light emitting element connected to the power feed line on a bottom face of the cavity, and a wavelength conversion layer provided within the cavity and containing a wavelength conversion material. When forming the wavelength conversion layer, a first resin with little or no wavelength conversion material can be filled inside the cavity such that the light emitting element surface is slightly exposed and a surface of the first resin is formed in a bowl shape. Then, a second resin with wavelength conversion material contained therein can be filled inside the cavity over the bowl-shaped first resin. These resins can be heated to be hardened. During heating, the viscosities of the resins are reduced to cause the wavelength conversion material to migrate and deposit around the light emitting element.

22 Claims, 4 Drawing Sheets

METHOD FOR MANUFACTURING AND SEMICONDUCTOR LIGHT EMITTING DEVICE

This application claims the priority benefit under 35 U.S.C. §119 of Japanese Patent Application No. 2004-284416 filed on Sep. 29, 2004, which is hereby incorporated in its entirety by reference.

BACKGROUND OF THE INVENTION

1. Field of the Invention

The invention relates to a method for manufacturing a semiconductor light emitting device and a semiconductor light emitting device. In particular, the invention relates to a semiconductor light emitting device and method for manufacturing a light emitting device that allows light to emit from a light emitting element through a wavelength conversion layer, mixes light emitted from the light emitting element for excitation with wavelength-converted light from the wavelength conversion layer, and then emits the light to the outside.

2. Detailed Description of the Related Art

Japanese Patent Laid-Open Publication No. 2004-119838 (JP'838) discloses an example of a conventional method for manufacturing an LED that is used as this type of wavelength conversion semiconductor light emitting device, and is shown in FIG. 1(A) and FIG. 1(B).

Namely, according to JP'838, a housing 1 is formed of a thermoplastic resin and has a light reflecting cavity 1a on the upper surface thereof as shown in FIG. 1(A). Lead frames 2 are insertion molded into the housing 1. The lead frames 2 are exposed on the bottom face inside the cavity 1a.

At the bottom of the cavity 1a, an LED chip 3 is placed on one of the lead frames 2 and is electrically connected to both lead frames 2 by die bonding or wire bonding (not shown in the figure).

Thereafter, a first sealing resin 5 is applied to the inside of the cavity 1a up to approximately half the height thereof to cover the LED chip 3. Then, a second sealing resin 6 is applied over the first sealing resin 5. A fluorescent material 6a is contained in the second sealing resin 6 to function as a wavelength conversion material and includes a specified quantity of particles. The fluorescent material 6a within the second sealing resin 6 is prepared with a particle concentration that does not allow those particles to precipitate during application.

Further, as shown in FIG. 1(B), the particulate fluorescent material 6a inside the second sealing resin 6 precipitates and migrates downwards by their own weight to the first sealing resin 5.

Lastly, the LED is completed by hardening the first sealing resin 5 and the second sealing resin 6.

According to the manufacturing method of an LED with this type of configuration, the upper surface of the first sealing resin 5 is made to be almost flat by applying a first sealing resin 5 that has a comparatively low viscosity inside the cavity 1a and without the fluorescent material 6a. In addition, the concentration distribution of the fluorescent material 6a is made to be almost uniform in the horizontal direction by applying the second sealing resin 6 at an almost uniform thickness over the first sealing resin 5.

After this, the fluorescent material 6a within the second sealing resin 6 precipitates by its own weight. After the precipitation, the concentration of the fluorescent material 6a is almost uniform in the horizontal direction. Thus, light emitting characteristics that do not have uneven color can be obtained.

The manufacturing method of an LED with this type of configuration has the following types of problems.

Namely, the second sealing resin 6 is applied at an almost uniform thickness and the particles of the fluorescent material 6a contained within that resin 6 precipitate through the first sealing resin 5. The LED chip 3 however, exists close to the center of the cavity 1a. Because of this, the concentration distribution of the fluorescent material 6a in the direction of height causes a difference in level to occur between a location over the LED chip 3 and a location at the bottom face of the cavity 1a around the chip 3. This difference in level is equal to the height of the LED chip 3.

Also, the excitation intensity of the fluorescent material 6a positioned on the periphery of the LED chip 3 becomes smaller as the distance from the LED chip 3 becomes further, thereby resulting in a decrease in the conversion efficiency for the entire LED.

Even further, due to precipitation, the fluorescent material 6a is dispersed uniformly in two dimensions (flatly) at the upper portion of the LED chip 3 and around the chip 3 in its final disposition. It is a well-known fact that when the LED chip 3 emits blue light in three dimensions, and the fluorescent material 6a converts the blue light into yellow light, a mixed color of light consisting of the blue light from the LED chip 3 and the wavelength-converted light produced by the fluorescent material 6a becomes a somewhat bluish white over the LED chip 3, and becomes yellowish white around the periphery of the LED chip 3.

Additionally, the fluorescent material 6a generates heat due to energy loss during the wavelength conversion. When the fluorescent material 6a is allowed to precipitate, the particles of the fluorescent material 6a precipitate through the first sealing resin 5, resulting in a lowered density of the fluorescent material 6a after precipitation. Consequently, the heat generated from the fluorescent material 6a passes through the first sealing resin 5 and reaches the housing 1 made of a thermoplastic resin, thereby dissipating to the outside. This in turn results in an inefficient and poor dissipation of heat due to insufficient thermal conductivity of both the first sealing resin 5 and the housing 1.

This type of problem not only occurs with blue LED chips but also similarly exists in LED chips which emit other colors, as well as in semiconductor light emitting devices, such as LEDs, which emit a mixed color of light consisting of and/or comprising light from other light emitting elements and wavelength-converted light from wavelength conversion material.

In addition, this problem is not only with LEDs of the type in which the lead frames are insertion molded. For example, the same types of problems occurs in semiconductor light emitting devices, such as LEDs, in which a cavity is formed on the upper surface of a semiconductor substrate and wherein the LEDs are provided with electrode layers composed of a conductive thin film. For example, LEDs in which the film wraps around from the bottom face of the cavity up to the upper surface of the substrate through the sides of the cavity and, according to circumstances, down along the side surfaces of the substrate to the rear surface thereof.

SUMMARY OF THE INVENTION

Taking into consideration the points mentioned above as well as other considerations, one of the various aspects of the invention is to provide a method for manufacturing a semiconductor light emitting device utilizing a simple configuration in which little or no uneven color occurs in a mixed color of light consisting of and/or comprising excitation light from a light emitting element and wavelength-converted light produced by a wavelength conversion material. Another aspect is to provide a method for manufacturing a semiconductor light emitting device which has efficient and favorable dissipation of heat that is emitted during energy loss by the wavelength conversion of light by the wavelength conversion material.

Another of the aspects of the invention is to provide a method for manufacturing a semiconductor light emitting device in which the semiconductor light emitting device can include: a housing having a cavity and a power feed line; a light emitting element electrically connected to the power feed line on a bottom face of the cavity; and a wavelength conversion layer provided within the cavity. The wavelength conversion layer can include particles of a wavelength conversion material that function to emit wavelength-converted light from the excitation light emitted by the light emitting element. The method can include a step of forming the wavelength conversion layer within the cavity, and the wavelength conversion layer forming step can include: a first step of filling a first optically transparent resin, with no wavelength conversion material, inside the cavity such that an upper surface of the light emitting element is slightly exposed and that a surface of the first optically transparent resin is formed in a bowl shape with the surface rising up towards the periphery; a second step of filling a second optically transparent resin, with the wavelength conversion material contained therein, inside the cavity over the first optically transparent resin; and a third step of hardening the first optically transparent resin and the second optically transparent resin.

In the method for manufacturing a semiconductor light emitting device as described above, the first optically transparent resin and the second optically transparent resin may each be a thermosetting resin which has properties that reduce the viscosity thereof when heated. In this case, when the first and second optically transparent resins are heated for hardening in the third step, the particles of the wavelength conversion material inside the second optically transparent resin precipitate downward due to the reduced viscosities of the first and second optically transparent resins, and then deposit on top of the light emitting element chip and around the chip.

Here, it can be beneficial for the cavity to widen upwards.

Furthermore, the wavelength conversion material may be a fluorescent material or the like.

In the method described above, the power feed line may be insertion molded within the housing and may include a lead frame that is exposed on a bottom face of the cavity.

Alternatively, the power feed line may include an electrode layer formed of a conductive thin film disposed at least partially on at least one of a surface of the housing, a side wall of the cavity, and a bottom face of the cavity.

Another aspect of the invention is a semiconductor light emitting device manufactured by the method for manufacturing a semiconductor light emitting device described above.

Still another aspect of the invention is a method for manufacturing a semiconductor light emitting device. The method can include: preparing or providing a housing having a cavity on an upper face of the housing and a power feed line; placing a light emitting element on or near a bottom face of the cavity and electrically connecting the light emitting element to the power feed line; and forming a wavelength conversion layer inside the cavity, the wavelength conversion layer containing particles of a wavelength conversion material that emits wavelength-converted light when excited by light from the light emitting element. The semiconductor light emitting device can emit a mixed light consisting of and/or comprising the light for excitation and the wavelength-converted light to the outside. The wavelength conversion layer forming step can include: a first step of filling a first optically transparent resin, with no wavelength conversion material, inside the cavity such that an upper surface of the light emitting element is slightly exposed and a surface of the first optically transparent resin is formed in a bowl shape with the surface rising up towards the periphery; a second step of filling a second optically transparent resin, with the wavelength conversion material contained therein, inside the cavity over the first optically transparent resin; and a third step of hardening the first optically transparent resin and the second optically transparent resin.

According to the configuration described above, in forming the wavelength conversion layer, initially, a first optically transparent resin is filled inside the cavity such that the upper surface of the light emitting element is slightly exposed. This is accompanied by the surface of the first optically transparent resin being formed in a bowl shape such that it rises up toward the periphery.

Consequently, the upper surface of the light emitting element is slightly exposed at the lowest area of the upper surface of the bowl-shaped first optically transparent resin.

From this state, a second optically transparent resin, that includes a wavelength conversion material, is then filled inside the cavity. Because of this, the thickness of the second optically transparent resin gradually becomes thinner radially from the center towards the periphery because the lower surface of the second optically transparent resin is formed in a bowl shape. Therefore, the concentration gradient of the wavelength conversion material that is contained in the second optically transparent resin is set such that it becomes lower radially as it extends towards the outside.

Thereafter, when the first and second optically transparent resins undergo heating for thermal hardening, the viscosities of these optically transparent resins temporarily fall, and the particles of the wavelength conversion material, which are contained within the second optically transparent resin, precipitate by their own weight and deposit on top of the light emitting element and on the bottom face of the cavity around the light emitting element. This completes the formation of the wavelength conversion layer.

During this process, because the concentration of the wavelength conversion material close to the light emitting element (around the periphery and on the upper surface) is high, the wavelength conversion material forms with a substantially uniform density in three dimensions around the light emitting element.

Consequently, the excitation intensity of the wavelength conversion material becomes almost uniform radially when contacted by the light emitted from the light emitting element. Thus, it is possible to obtain light emitting characteristics substantially without uneven color on the whole.

The upper surface of the light emitting element can be directly in contact with the second optically transparent resin. Because of this, the particles of the wavelength conversion material deposit directly onto the upper surface of the light emitting element.

Therefore, even if the particles of the wavelength conversion material generate heat due to energy loss during wavelength conversion while driving the semiconductor light emitting device, this heat will be dissipated from the light emitting element through the housing and the like, thereby obtaining an efficient and favorable dissipation of heat.

Because this also results in control of temperature increases for the light emitting element and, in turn, the semiconductor light emitting device, there is little or no reduction in the light emission efficiency due to temperature increases.

The first and second optically transparent resins described above can be composed of a thermosetting resin that has properties which temporarily reduce the viscosity while the resin is being heated. Consequently, when the first and second optically transparent resins are heated to be hardened in the third step described above, the particles of the wavelength conversion material within the second optically transparent resin can precipitate downward by their own weight due to the reduced viscosities of the resins. When the first and second optically transparent resins are heated to be hardened and the particles of the wavelength conversion material are deposited on top of the light emitting element and around the element in this manner, the particles of the wavelength conversion material, contained within the second optically transparent resin, can be deposited directly on top of the light emitting element and on the bottom face of the cavity around the element through the first optically transparent resin. This results in an improvement in the heat dissipation characteristics from the wavelength conversion material.

When the cavity described above is formed such that it widens upwards, the light emitted from the light emitting element and/or the wavelength-converted light emitted from the wavelength conversion material can be incident on the side wall of the light reflecting cavity and reflected upwards, thereby improving the extraction efficiency of the light.

If the light from the light emitting element is incident to the wavelength conversion material when the wavelength conversion material is a fluorescent material, the wavelength conversion material will be excited and emit fluorescent light as the wavelength-converted light.

Principles of the invention can be applied to a lead frame type semiconductor light emitting device, especially when the power feed line to the light emitting element is insertion molded within the housing and also composed of a lead frame exposed on the bottom face of the cavity.

Principles of the invention can also be applied to a surface mount type semiconductor light emitting device that uses a semiconductor substrate, for example, when the power feed line to the light emitting element is composed of electrode layers formed of a conductive thin film on the surface of the substrate as well as on the side wall and the bottom face of the cavity.

When filling the cavity with optically transparent resin, initially, a first optically transparent resin that does not contain a wavelength conversion material is filled inside the cavity such that the upper surface of the light emitting element is slightly exposed and the resin slopes in a bowl shape from the upper surface of the light emitting element towards the periphery of the light emitting device. Thereafter, a second optically transparent resin that contains a wavelength conversion material can be filled over the first optically transparent resin so as to form the lower surface of the second optically transparent resin in a bowl shape with the thickness gradually becoming thinner towards the periphery.

According to this configuration, the quantity of the wavelength conversion material contained in the second optically transparent resin has a concentration gradient that gradually decreases towards the periphery. Because of this, when the viscosities of the first and second optically transparent resins temporarily drop while the optically transparent resins undergo thermal hardening, the particles of the wavelength conversion material contained within the second optically transparent resin precipitate by their own weight and deposit on top of the light emitting element and on the bottom face of the cavity around the light emitting element.

The wavelength conversion material at this time has a substantially uniform density in three dimensions around a center located at the light emitting element, and substantially uniform light emitting characteristics without uneven color are obtained. Since the wavelength conversion material can be deposited directly onto the light emitting element, heat generated by the wavelength conversion material due to energy loss during wavelength conversion is efficiently dissipated from the substrate through the light emitting element.

BRIEF DESCRIPTION OF THE DRAWINGS

The above-described and other benefits, characteristics and/or advantages will become more clear from the following description with reference to the accompanying drawings, wherein.

DETAILED DESCRIPTION OF PREFERRED EMBODIMENTS

In the following description, exemplary embodiments of the invention will be described in detail with reference to FIG. 2 to FIG. 4.

The embodiments described below are concrete examples of the invention and, although there are some technically preferred features, the scope of the invention is not limited to these embodiments.

Figure 1A:
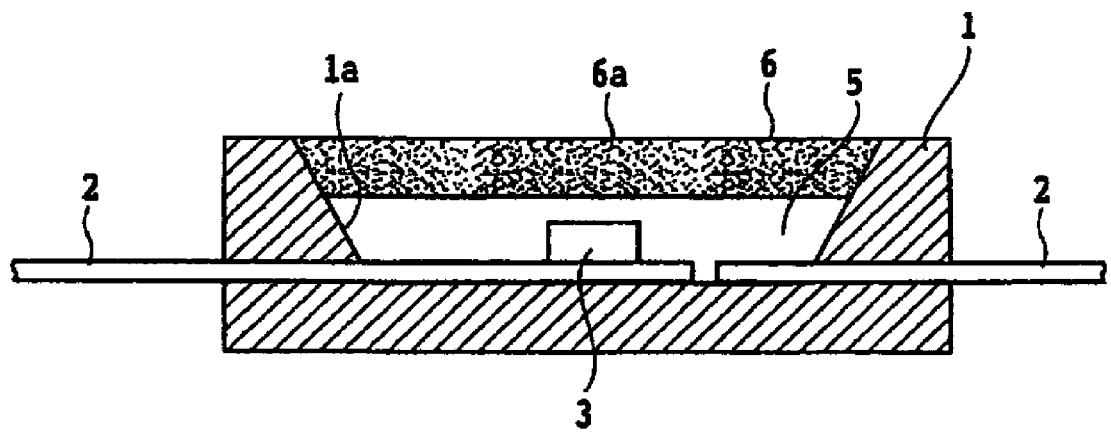
FIG. 1A and FIG. 1B are schematic cross-sectional views showing manufacturing steps according to one conventional example of an LED manufacturing method in order.
Figure 1B:
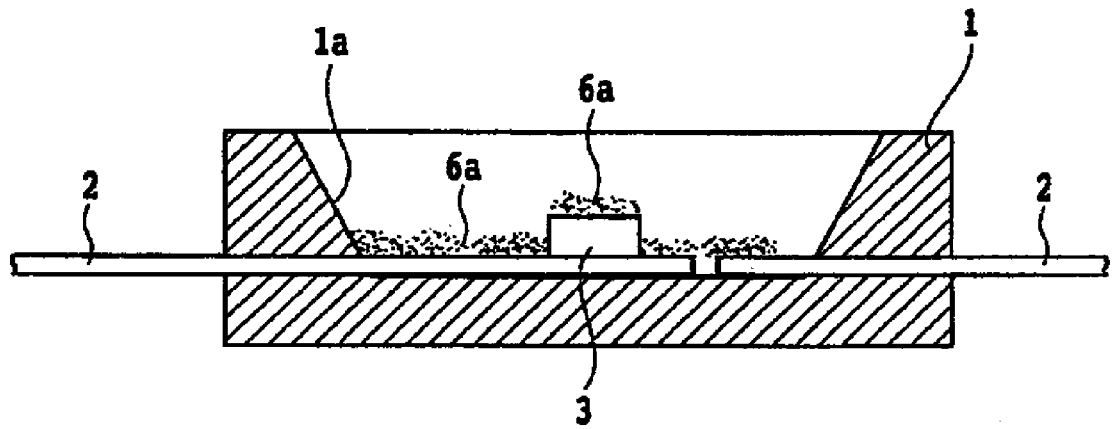
Figure 2:
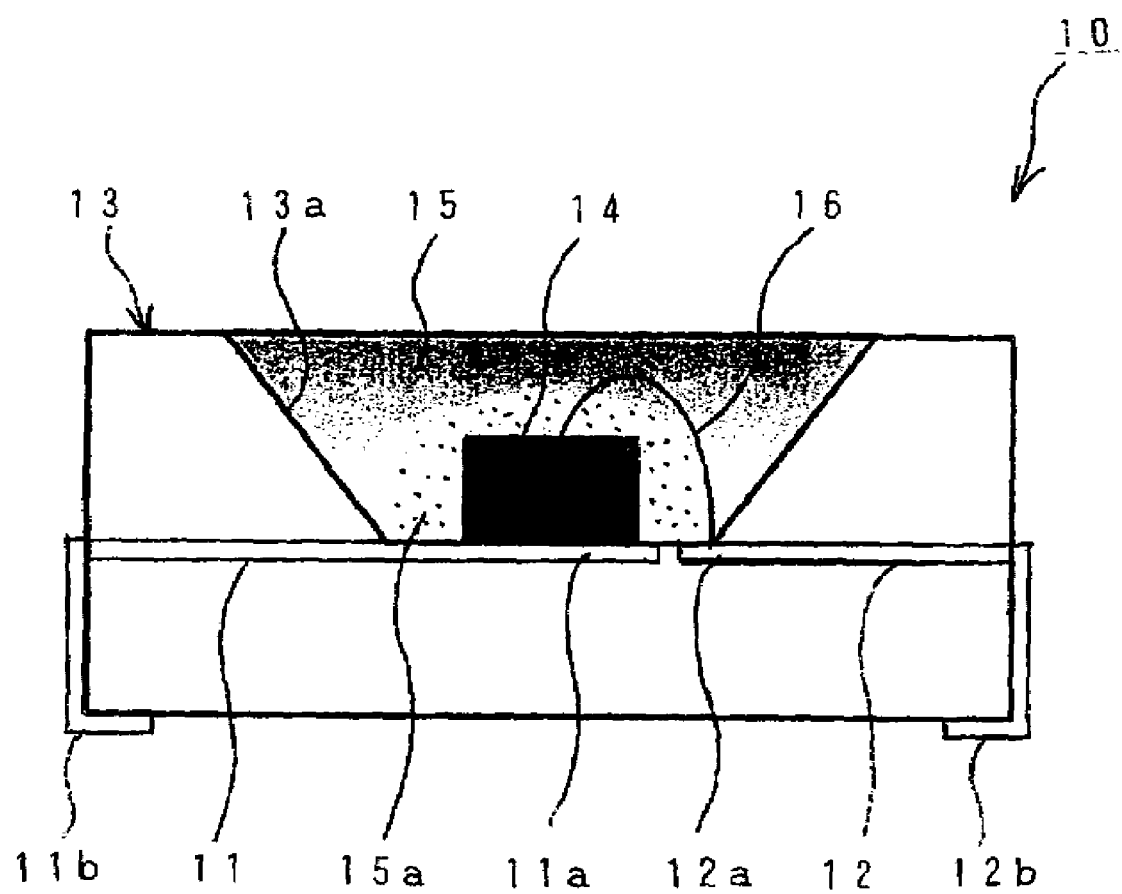
FIG. 2 is a schematic cross-sectional view showing the configuration of an embodiment of an LED manufactured by a manufacturing method according to principles of the invention.

FIG. 2 shows an embodiment of an LED made by a method in accordance with the principles of the invention, the LED functioning as a semiconductor light emitting device.

In FIG. 2, the LED 10 can include: a pair of lead frames 11 and 12; a housing 13 integrally formed so as to maintain these lead frames 11 and 12 at a fixed position; a blue LED chip 14 mounted on a chip mounting portion 11a of one of the lead frames 11 exposed within a cavity 13a that is provided on the upper surface of the housing 13; and a wavelength conversion layer 15 that includes a wavelength conversion material (for example, a fluorescent material) mixed therein, formed so as to encircle the blue LED chip 14 inside the cavity 13a of the housing 13.

The lead frames 11 and 12 can be formed from a conductive material such as aluminum, etc. The lead frames 11 and 12 are provided with the chip mounting portion 11a and a bonding portion 12a, respectively, on the respective ends exposed within the cavity 13a. The frames 11 and 12 may wrap around from the respective side walls of the housing 13 to the lower surface, and the other ends thereof constitute connection portions 11b and 12b for surface mounting, respectively.

These lead frames 11 and 12 can be produced by press molding a metal plate into a predetermined shape.

The housing 13 can be integrally formed with these lead frames 11 and 12 serving as inserts by an insertion molding process. The cavity 13a can be provided at the center of the upper surface of the housing 13 while widening upwards in a bowl shape.

The chip mounting portion 11a and the bonding portion 12a of the respective ends of the lead frames 11 and 12 are exposed on the bottom face of the cavity 13a.

The blue LED chip 14 can be connected to the top of the chip mounting portion 11a of the lead frame 11 inside the cavity 13a of the housing 13. An electrode, provided on the chip surface, can be electrically connected by a bonding wire 16 to the bonding portion 12a of the lead frame 12 disposed adjacent to the chip and exposed within the cavity 13a. The blue LED chip 14 can emit blue light when a drive voltage is applied thereto.

The wavelength conversion layer 15 can be formed of a high heat resistant thermosetting transparent resin, such as a transparent epoxy resin, mixed with a wavelength conversion material 15a (for example, minute particles of a fluorescent material). In this configuration, the wavelength conversion material 15a precipitates into the lower side of this layer 15.

When the blue light from the blue LED chip 14 is incident to this wavelength conversion layer 15, the wavelength conversion material 15a is excited by the light from the LED chip 14 to emit yellow light. The blue light from the LED chip 14 and the yellow light from the wavelength conversion material 15a mix to produce a white light. This white light is then radiated outward.

The wavelength conversion material 15a can use, for example, any of the following: a YAG wavelength conversion material doped with an element such as cerium or gadolinium; a wavelength conversion material that substitutes the yttrium of the YAG wavelength conversion material with another element; and an ortho-silicate based wavelength conversion material. In this embodiment the wavelength conversion material 15a is set to emit a fluorescent yellow light upon excitation by blue light from the LED chip 14.

According to this embodiment, the wavelength conversion layer 15 is formed as follows.

Figure 3A:
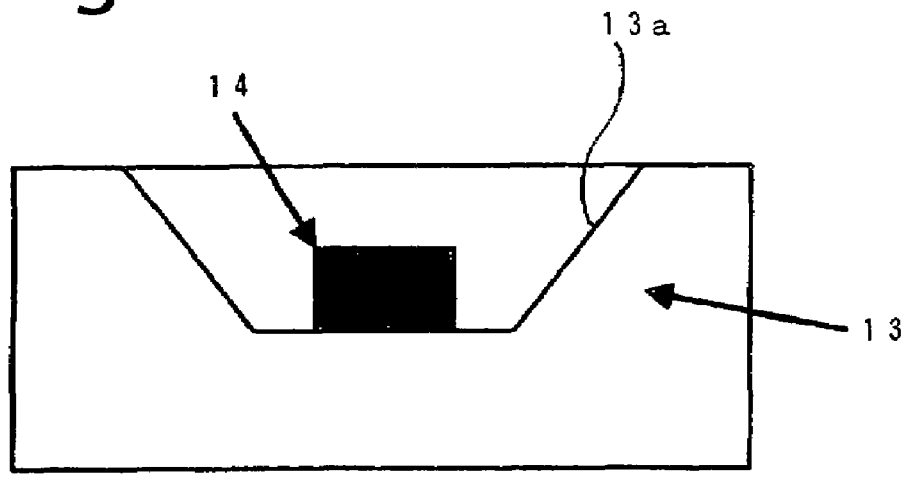
FIG. 3A, FIG. 3B, and FIG. 3C are schematic cross-sectional views showing a manufacturing process for the wavelength conversion layer of the LED shown in FIG. 2.
Figure 3B:
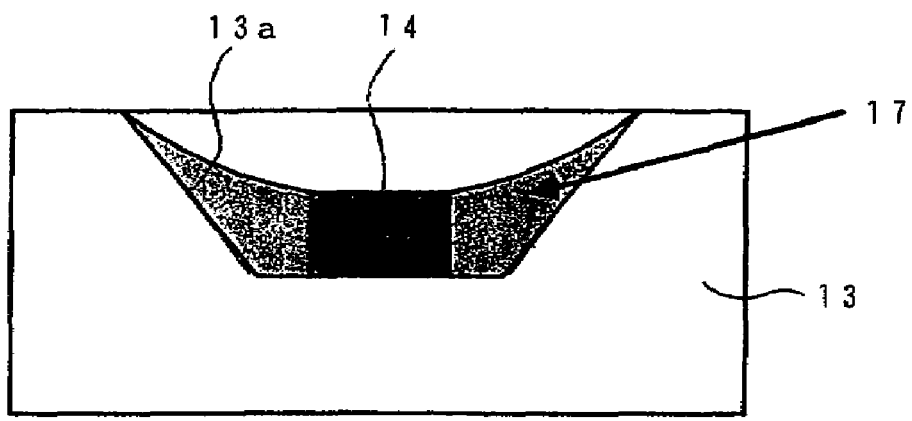
Figure 3C:
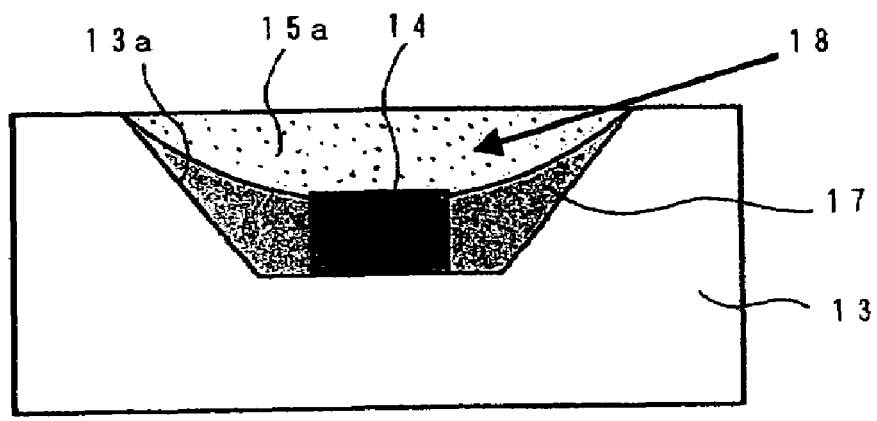

Namely, referring to FIG. 3(A), the blue LED chip 14 is mounted to the chip mounting portion 11a of the lead frame 11 exposed at the inside of the cavity 13a of the housing 13. As shown in FIG. 3(B), in this state a first optically transparent resin is initially injected and filled inside the cavity 13a. This first optically transparent resin 17 can be composed of an epoxy resin that does not contain the wavelength conversion material 15a.

In particular, the first optically transparent resin 17 can be composed of a thermosetting resin that experiences a temporarily reduced viscosity thereof for a comparatively short period of time during heating.

The first optically transparent resin 17 can be filled to a height that slightly exposes the upper surface of the blue LED chip 14 at the center and also slopes upwards in a bowl shape from the upper surface of the blue LED chip 14 towards the periphery.

Next, a second optically transparent resin 18, that contains the wavelength conversion material 15a, can be injected and filled inside of the cavity 13a over the first bowl shaped optically transparent resin 17. At this time, the surface of the filled resin 18 is formed to a height almost identical to the upper surface of the housing 13.

The second optically transparent resin 18 can also be composed of a thermosetting resin that experiences a temporary reduction in viscosity for a comparatively short period of time during heating in the same manner.

Because of this, the lower surface of the second optically transparent resin 18 is formed in a bowl shape in accordance with the shape of the upper surface of the first optically transparent resin 17. Consequently, the thickness of the resin 18 gradually becomes thinner as it radiates towards the periphery. In other words, the concentration gradient of the wavelength conversion material 15a contained in the second optically transparent resin 18 is set so as to become lower in a radial direction towards the outside.

Thereafter, the housing 13 is placed in a resin hardening device and the first optically transparent resin 17 and the second optically transparent resin 18 are heated to be hardened.

At this time, the viscosities of the first and second optically transparent resins 17 and 18 are temporarily reduced for a comparatively short period of time. Because of this, the particles of the wavelength conversion material 15a contained in the second optically transparent resin 18 precipitate by their own weight and migrate to the first optically transparent resin 17. Therefore, as shown in FIG. 2, the wavelength conversion material 15a is deposited at a high density on top of the blue LED chip 14 as well as at the bottom of the cavity 13a around the periphery of the LED chip.

The wavelength conversion material 15a within the second optically transparent resin 18 as described above can be given a concentration gradient in the radial direction. Accordingly, little or no difference in concentration level occurs in the distribution of the wavelength conversion material 15a between the upper surface of the blue LED chip 14 and around the periphery thereof. Thus, the wavelength conversion material can be substantially uniformly deposited in three dimensions.

Consequently, both the blue light emitted from the blue LED chip 14 and the yellow light produced by wavelength conversion by the wavelength conversion material 15a are emitted, and white light is formed by this mixture of light. Light emitting characteristics having substantially even color can be obtained by the uniform distribution in three dimensions of the wavelength conversion material 15a at this time.

As described above, because the wavelength conversion material 15a is deposited at a high density on top of the blue LED chip 14 as well as around the chip 14, the wavelength conversion material 15a can be directly deposited on top of the blue LED chip 14 as well as on the bottom face of the cavity 13a around the chip.

Because of this, even if heat is generated by energy loss during wavelength conversion of the wavelength conversion material 15a when the LED 10 is operated, this heat will be efficiently transmitted to the blue LED chip 14 as well as the housing 13, thereby making it easy to dissipate the heat. Consequently, the light emitting efficiency is not reduced due to a temperature rise of the blue LED chip 14 caused by heat generated by the wavelength conversion material 15a. This can provide a favorable light emitting efficiency for the light as a whole.

According to the LED 10 in this embodiment, initially the first optically transparent resin 17 is filled inside the cavity 13a in a bowl shape when forming the wavelength conversion layer 15. Thereafter, the second optically transparent resin 18, into which the wavelength conversion material 15a is mixed, is filled inside the cavity 13a over the first optically transparent resin 17. This provides the wavelength conversion material 15a, contained in the second optically transparent resin 18, with a concentration gradient that gradually becomes lower towards the periphery.

When the first and second optically transparent resins 17 and 18 in this state are heated to be hardened, the viscosities of these resins become comparatively lower. Because of this, the wavelength conversion material 15a, contained within the second optically transparent resin 18, precipitates by its own weight and migrates to the first optically transparent resin 17. The wavelength conversion material 15a then deposits around and possibly on the upper surface of the blue LED chip 14 and around and possibly on the bottom face of the cavity 13a around the chip 14.

This provides the wavelength conversion material 15a with a substantially uniform density in three dimensions centered at the blue LED chip 14 and around the blue LED chip 14. Therefore, the excitation intensity of the wavelength conversion material 15a due to the blue light from the blue LED chip 14 is also substantially uniform and light emitting characteristics can be obtained that do not include uneven color on the whole.

Figure 4:
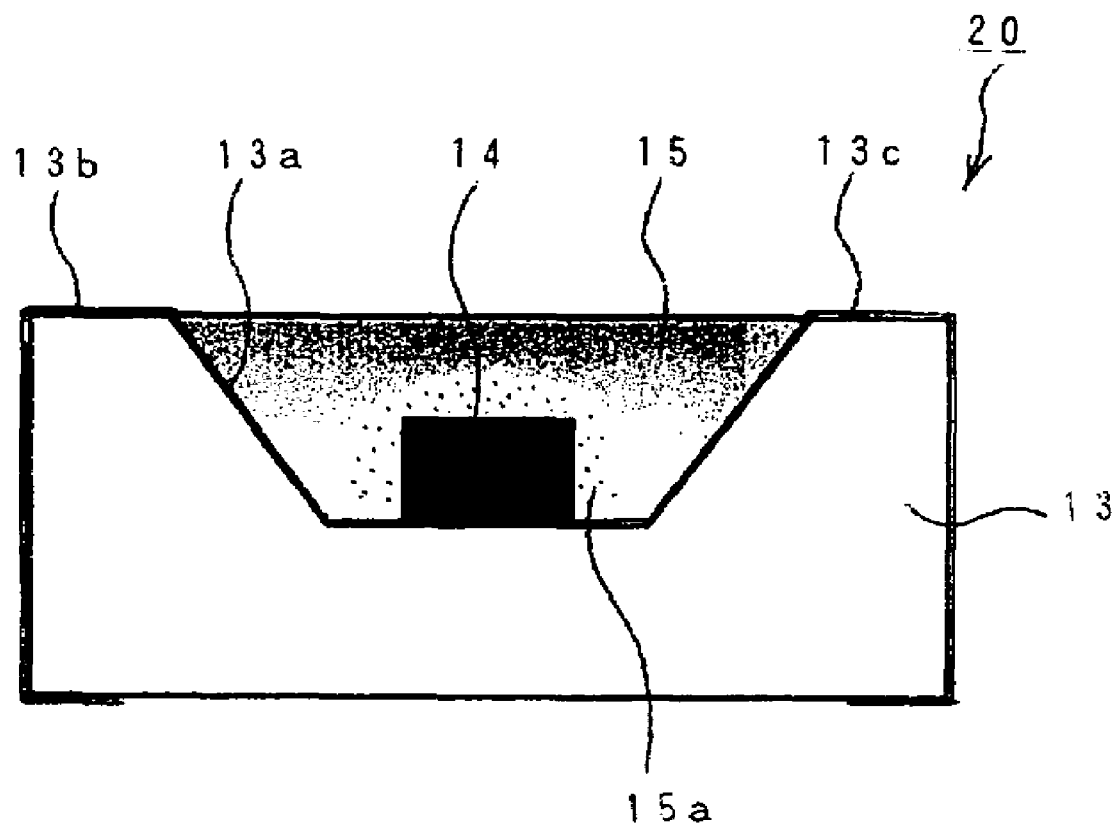
FIG. 4 is a schematic cross-sectional view showing the configuration of another embodiment of an LED manufactured by a manufacturing method according to principles of the invention.

FIG. 4 shows another embodiment of a method in accordance with the principles of the invention for manufacturing an LED that serves as a semiconductor light emitting device.

The LED 20 of FIG. 4 is an LED that does not use the lead frames 11 and 12 as shown in the LED 10 of FIG. 2. Instead, the LED 20 is provided with electrode layers 13b and 13c. The electrode layers 13b and 13c can be formed of a conductive thin film such as a metal, and extend from the bottom face of the cavity 13a of the housing 13 (a semiconductor substrate, for example) through a sloped side wall up to the upper surface of the housing 13.

The wavelength conversion layer 15 formed inside the cavity 13a can be formed in a similar manner to the LED 10 described above as shown in FIG. 3A to 3C.

When forming the wavelength conversion layer 15, initially the first optically transparent resin 17 is filled inside the cavity 13a in a bowl shape. Thereafter, the second optically transparent resin 18, into which the wavelength conversion material 15a is mixed, is filled inside the cavity 13a over the first optically transparent resin 17. This provides the wavelength conversion material 15a, contained in the second optically transparent resin 18, with a concentration gradient that gradually becomes lower towards the periphery.

When the first and second optically transparent resins 17 and 18 in this state are heated to be hardened, the viscosities of these resins become comparatively lower. Because of this, the wavelength conversion material, contained inside the second optically transparent resin 18, precipitates by its own weight and migrates to the first optically transparent resin 17. The wavelength conversion material then deposits around and possibly on the upper surface of the blue LED chip 14 and around and possibly on the bottom face of the cavity 13a around the chip 14.

This provides the wavelength conversion material 15a with a substantially uniform density in three dimensions centered at the blue LED chip 14 and around the blue LED chip 14. Therefore, the excitation intensity of the wavelength conversion material 15a due to the blue light from the blue LED chip 14 is also substantially uniform, and light emitting characteristics can be obtained that do not have uneven color on the whole.

In the embodiment described above, although the cavity 13a is formed such that it widens upwards, the invention is not limited to this. The side wall of the cavity 13a can also be perpendicular with respect to the bottom face, for example.

Furthermore, although the blue LED chip 14 is used as a light emitting element in the embodiment described above, the invention is not limited to this. For example, the LED chip can emit another color of light or a light emitting element with another configuration can also be used.

In addition, the steps of the method can be sequential or non-sequential, depending on particular circumstances and desired productions schemes.

For this case, although the wavelength conversion material 15a is selected to wavelength-convert blue light to yellow light, the invention is not limited to this. For example, a wavelength conversion material can be selected that wavelength-converts an emission color to a suitable color of light corresponding to the emission color of light for excitation from a light emitting element that contains an LED chip.

According to the above-described embodiment, it is possible to provide a method for manufacturing a semiconductor light emitting device utilizing a simple configuration in which substantially no uneven color occurs in a mixed color of light consisting of and/or comprising excitation light from a light emitting element and wavelength-converted light. Efficient and favorable dissipation of heat that is generated by the energy loss during the wavelength conversion of the wavelength conversion material can also be realized by a semiconductor light emitting device made in accordance with the principles of the above described method.

While there has been described what are at present considered to be beneficial and exemplary embodiments of the invention, it will be understood that various modifications may be made thereto, and it is intended that the appended claims cover all such modifications as fall within the true spirit and scope of the invention.

What is claimed is:

1. A method for manufacturing a semiconductor light emitting device, comprising:
   providing a housing having a cavity, a power feed line, and a light emitting element electrically connected to the power feed line and located adjacent a bottom face of the cavity;
   forming a wavelength conversion layer within the cavity, the wavelength conversion layer forming including,
      filling a first optically transparent resin inside the cavity such that at least a portion of an upper surface of the light emitting element is exposed and a surface of the first optically transparent resin is formed in a substantial bowl shape with the surface of the first optically transparent resin rising upwards toward a periphery of the first optically transparent resin,
      filling a second optically transparent resin inside the cavity and over the first optically transparent resin, the second optically transparent resin including a wavelength conversion material, and
      hardening the first optically transparent resin and the second optically transparent resin.

2. The method for manufacturing a semiconductor light emitting device according to claim 1, wherein:
   the first optically transparent resin and the second optically transparent resin are each a thermosetting resin which has properties that reduce the viscosity thereof when heated, and the wavelength conversion material is a particulate material; and
   hardening the first and second optically transparent resins includes heating the first and second optically transparent resins such that particles of the wavelength conversion material inside the second optically transparent resin precipitate downward due to the reduced viscosities of the first and second optically transparent resins and deposit adjacent a top of and around the light emitting element.

3. The method for manufacturing a semiconductor light emitting device according to claim 1, wherein the cavity widens upwards.

4. The method for manufacturing a semiconductor light emitting device according to claim 2, wherein the cavity widens upwards.

5. The method for manufacturing a semiconductor light emitting device according to claim 1, wherein the wavelength conversion material is a fluorescent material.

6. The method for manufacturing a semiconductor light emitting device according to claim 2, wherein the wavelength conversion material is a fluorescent material.

7. The method for manufacturing a semiconductor light emitting device according to claim 3, wherein the wavelength conversion material is a fluorescent material.

8. The method for manufacturing a semiconductor light emitting device according to claim 1, further comprising:
 insertion molding the power feed line within the housing, the power feed line including a lead frame that is exposed at a bottom face of the cavity.

9. The method for manufacturing a semiconductor light emitting device according to claim 2, further comprising:
 insertion molding the power feed line within the housing, the power feed line including a lead frame that is exposed at a bottom face of the cavity.

10. The method for manufacturing a semiconductor light emitting device according to claim 3, further comprising:
 insertion molding the power feed line within the housing, the power feed line including a lead frame that is exposed at a bottom face of the cavity.

11. The method for manufacturing a semiconductor light emitting device according to claim 4, further comprising:
 insertion molding the power feed line within the housing, the power feed line including a lead frame that is exposed at a bottom face of the cavity.

12. The method for manufacturing a semiconductor light emitting device according to claim 1, wherein:
 the power feed line includes an electrode layer formed of a conductive thin film on at least one of a surface of the housing, a side wall of the cavity, and the bottom face of the cavity.

13. The method for manufacturing a semiconductor light emitting device according to claim 2, wherein:
 the power feed line includes an electrode layer formed of a conductive thin film on at least one of a surface of the housing, a side wall of the cavity, and the bottom face of the cavity.

14. The method for manufacturing a semiconductor light emitting device according to claim 3, wherein:
 the power feed line includes an electrode layer formed of a conductive thin film on at least one of a surface of the housing, a side wall of the cavity, and the bottom face of the cavity.

15. The method for manufacturing a semiconductor light emitting device according to claim 4, wherein:
 the power feed line includes an electrode layer formed of a conductive thin film on at least one of a surface of the housing, a side wall of the cavity, and the bottom face of the cavity.

16. The method for manufacturing a semiconductor light emitting device according to claim 1, wherein the first optically transparent resin includes substantially no wavelength conversion material.

17. A semiconductor light emitting device manufactured by the method for manufacturing a semiconductor light emitting device according to claim 1.

18. A method for manufacturing a semiconductor light emitting device, comprising:
 providing a housing having a cavity on an upper face of the housing and a power feed line;
 placing a light emitting element adjacent a bottom face of the cavity and electrically connecting the light emitting element to the power feed line; and
 forming a wavelength conversion layer inside the cavity that is configured such that the wavelength conversion layer includes particles of a wavelength conversion material configured to emit wavelength-converted light when exposed to excitation light from the light emitting element, and such that the semiconductor light emitting device emits a mixed light including the excitation light and the wavelength-converted light,
 the wavelength conversion layer forming including,
  filling a first optically transparent resin inside the cavity such that at least a portion of an upper surface of the light emitting element is exposed and a surface of the first optically transparent resin is formed in a substantial bowl shape with the surface of the first optically transparent resin rising up toward a periphery of the first optically transparent resin,
  filling a second optically transparent resin inside the cavity over the first optically transparent resin, the second optically transparent resin including the wavelength conversion material, and
  hardening the first optically transparent resin and the second optically transparent resin.

19. The method for manufacturing a semiconductor light emitting device according to claim 18, wherein the first optically transparent resin includes substantially no wavelength conversion material.

20. The method for manufacturing a semiconductor light emitting device according to claim 18, wherein:
 the first optically transparent resin and the second optically transparent resin are each a thermosetting resin which has properties that reduce the viscosity of the thermosetting resin when heated; and
 hardening the first and second optically transparent resins includes heating the first and second optically transparent resins such that particles of the wavelength conversion material inside the second optically transparent resin precipitate downward due to the reduced viscosities of the first and second optically transparent resins and deposits adjacent a top of and around the light emitting element.

21. The method for manufacturing a semiconductor light emitting device according to claim 18, further comprising:
 insertion molding the power feed line within the housing, wherein the power feed line includes a lead frame that is exposed at a bottom face of the cavity.

22. The method for manufacturing a semiconductor light emitting device according to claim 18, wherein
 the power feed line includes an electrode layer formed of a conductive thin film on at least one of a surface of the housing, a side wall of the cavity, and the bottom face of the cavity.

* * * * *